United States Patent
Sugiyama et al.

(10) Patent No.: US 10,214,619 B2
(45) Date of Patent: Feb. 26, 2019

(54) PROCESS FOR PRODUCING FLUORINATED CROSSLINKED PRODUCT AND USE THEREOF

(71) Applicant: AGC Inc., Chiyoda-ku (JP)

(72) Inventors: Norihide Sugiyama, Chiyoda-ku (JP); Ryujiro Yamasaki, Chiyoda-ku (JP); Susumu Saito, Chiyoda-ku (JP); Akihiko Asakawa, Chiyoda-ku (JP); Masahiro Ohkura, Chiyoda-ku (JP); Shinji Wada, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/176,408

(22) Filed: Jun. 8, 2016

(65) Prior Publication Data

US 2016/0280865 A1 Sep. 29, 2016

Related U.S. Application Data

(63) Continuation of application No. PCT/JP2014/083785, filed on Dec. 19, 2014.

(30) Foreign Application Priority Data

Dec. 26, 2013 (JP) .................................. 2013-270102

(51) Int. Cl.
*C08J 3/24* (2006.01)
*C08F 214/18* (2006.01)
*C08J 3/28* (2006.01)
*H01L 33/56* (2010.01)

(52) U.S. Cl.
CPC .............. *C08J 3/24* (2013.01); *C08F 214/18* (2013.01); *C08F 214/184* (2013.01); *C08J 3/28* (2013.01); *H01L 33/56* (2013.01); *C08J 2327/12* (2013.01)

(58) Field of Classification Search
CPC .. C08J 3/24; C08J 3/28; C08J 2327/12; C08F 214/18; C08F 214/184; H01L 33/56
USPC ........................................................ 522/156
See application file for complete search history.

(56) References Cited

U.S. PATENT DOCUMENTS

| 2004/0019176 | A1 | 1/2004 | Araki et al. | |
| 2006/0008652 | A1 | 1/2006 | Araki et al. | |
| 2006/0138443 | A1* | 6/2006 | Fan | H01L 33/56 |
| | | | | 257/100 |
| 2009/0118429 | A1 | 5/2009 | Sugiyama et al. | |
| 2010/0144993 | A1* | 6/2010 | Araki | C08F 14/18 |
| | | | | 526/245 |

FOREIGN PATENT DOCUMENTS

| EP | 1 347 001 A1 | 9/2003 |
| JP | 11-302394 | 11/1999 |
| WO | WO 2002/18457 A1 | 3/2002 |
| WO | WO 2007/145181 A1 | 12/2007 |
| WO | WO 2009/096342 A1 | 8/2009 |

OTHER PUBLICATIONS

International Search Report dated Mar. 10, 2015 in PCT/JP2014/083785, filed Dec. 19, 2014.

* cited by examiner

Primary Examiner — Sanza L. McClendon
(74) Attorney, Agent, or Firm — Oblon, McClelland, Maier & Neustadt, L.L.P.

(57) ABSTRACT

To provide a process for producing a fluorinated crosslinked product which is excellent in stability and produces less HF. A process for producing a fluorinated crosslinked product, which comprises irradiating a fluorinated polymer having a unit represented by the following formula (1), with active energy rays having a wavelength of from 150 to 300 nm:

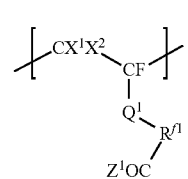

(1)

wherein $X^1$ and $X^2$ are each independently a hydrogen atom or a fluorine atom, $R^{f1}$ is a fluoroalkylene group or a fluoroalkylene group having at least two carbon atoms and an etheric oxygen atom between carbon-carbon atoms, $Q^1$ is a single bond or an etheric oxygen atom, and $Z^1$ is OH, $OR^1$ or $NR^2R^3$, wherein $R^1$ is an alkyl group, and $R^2$ and $R^3$ are each independently a hydrogen atom or an alkyl group.

11 Claims, No Drawings

PROCESS FOR PRODUCING FLUORINATED CROSSLINKED PRODUCT AND USE THEREOF

This application is a continuation of PCT Application No. PCT/JP2014/083785, filed on Dec. 19, 2014, which is based upon and claims the benefit of priority from Japanese Patent Application No. 2013-270102 filed on Dec. 26, 2013. The contents of those applications are incorporated herein by reference in its entirety.

TECHNICAL FIELD

The present invention relates to a process for producing a fluorinated crosslinked product, and an optical material and an optical device using the fluorinated crosslinked product.

BACKGROUND ART

In recent years, as a next generation high efficiency illumination light source, a white LED (light emitting diode) has been put into a practical use instead of an incandescent lamp or a fluorescent lamp. The white LED has been combined with a blue LED and a yellow phosphor, and further with e.g. a red phosphor as the case requires, so as to be adjusted to daylight white or bulb-color. In order to protect an LED device from external physical and chemical actions, an LED package has been encapsulated with a light-transmitting resin, such as a silicone resin. However, light sources requiring a high output power, such as headlights for automobiles, may deteriorate the light-transmitting resin used for encapsulation, since light emitted from the device has a very high energy density and further the surface of the device becomes a high temperature due to heat generation. If the light-transmitting resin is thus deteriorated, the light emitting output will decrease, and the lifetime as a light source will be short. Further, in recent years, an UV-LED having a higher output power has been more utilized as a light source as an alternative to a mercury lamp, but there are no ultraviolet-ray resistant resin at present.

Patent Documents 1 and 2 have proposed a liquid-state curable fluorinated polymer having a $CF_2=CFO-$ (perfluorovinyl ether) group, which is thermally cured or UV cured to obtain a cured product excellent in heat resistance or light resistance.

PRIOR ART DOCUMENTS

Patent Documents

Patent Document 1: WO07/145181
Patent Document 2: WO09/096342

DISCLOSURE OF INVENTION

Technical Problem

The present inventors have conducted studies and found that cured products disclosed in Patent Documents 1 and 2 are still needed to have more improved stability when used as an encapsulating resin for a light source requiring a high output power. As a specific example, a $CF_2=CFO-$ group has high reactivity, but on the other hand, it undergoes reaction with oxygen in air and thereby decomposes to a volatile compound having a —COF (carboxylic acid fluoride) group. Further, the —COF group undergoes reaction with moisture in air and thereby produces HF. Thus, an unreacted $CF_2=CFO-$ group remaining in a cured product gradually undergoes reaction with oxygen and moisture in air over a long period and thereby produces HF which may corrode peripheral metal members such as electrodes when the cured product is used as a resin for encapsulating a light emitting device requiring a high output power.

It is an object of the present invention to provide a process for producing a fluorinated crosslinked product which produces less HF and is excellent in stability.

Solution to Problem

The present invention provides a process for producing a fluorinated crosslinked product, and a light emitting device, having the following constructions [1] to [14].

[1] A process for producing a fluorinated crosslinked product, which comprises irradiating a fluorinated polymer having a unit represented by the following formula (1), with active energy rays having a wavelength of from 150 to 300 nm:

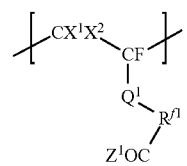

(1)

wherein $X^1$ and $X^2$ are each independently a hydrogen atom or a fluorine atom, $R^{f1}$ is a fluoroalkylene group or a fluoroalkylene group having at least two carbon atoms and an etheric oxygen atom between carbon-carbon atoms, $Q^1$ is a single bond or an etheric oxygen atom, and $Z^1$ is OH, $OR^1$ or $NR^2R^3$, wherein $R^1$ is an alkyl group, and $R^2$ and $R^3$ are each independently a hydrogen atom or an alkyl group.

[2] The process for producing a fluorinated crosslinked product according to [1], wherein the unit represented by the formula (1) is $-[CF_2-CF(O(CF_2)_3COOCH_3)]-$ or $-[CF_2-CF(OCF_2CF(CF_3)O(CF_2)_3COOCH_3)]-$.

[3] The process for producing a fluorinated crosslinked product according to [1] or [2], wherein the fluorinated polymer further contains a unit (2) having an alicyclic structure in its main chain.

[4] The process for producing a fluorinated crosslinked product according to [3], wherein the unit (2) is at least one member selected from the group consisting of units represented by the following formulae (2-1) to (2-4):

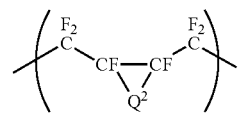

(2-1)

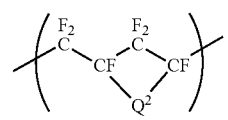

(2-2)

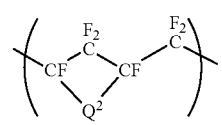

(2-3)

-continued

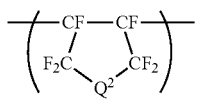
(2-4)

wherein $Q^2$ is a $C_{1-5}$ perfluoroalkylene group which may have an etheric oxygen atom, and in which some of fluorine atoms may be substituted by halogen atoms other than fluorine atoms.

[5] The process for producing a fluorinated crosslinked product according to any one of [1] to [4], wherein the fluorinated polymer further contains a unit derived from a fluoroethylene.

[6] The process for producing a fluorinated crosslinked product according to [5], wherein the fluoroethylene is tetrafluoroethylene, trifluoroethylene or chlorofluoroethylene.

[7] The process for producing a fluorinated crosslinked product according to any one of [1] to [6], wherein the fluorinated polymer further contains a unit represented by the following formula (4):

—[CX³X⁴—CY¹Y²]—  (4)

wherein $X^3$ and $X^4$ are each independently a hydrogen atom, a fluorine atom or a chlorine atom, $Y^1$ is a hydrogen atom, a fluorine atom or a chlorine atom, $Y^2$ is a hydrogen atom, a fluoroalkyl group which may have an etheric oxygen atom between carbon-carbon atoms, a fluoroalkoxy group which may have an etheric oxygen atom between carbon-carbon atoms, or a fluoroalkenyl group which may have an etheric oxygen atom between carbon-carbon atoms.

[8] The process for producing a fluorinated crosslinked product according to [7], wherein the unit represented by the formula (4) is a unit derived from a perfluoromethyl vinyl ether, a unit derived from a perfluoropropyl vinyl ether, a unit derived from hexafluoropropene or a unit derived from ethylene.

[9] The process for producing a fluorinated crosslinked product according to any one of [1] to [8], wherein the fluorinated polymer has a mass average molecular weight of from 3,000 to 20,000.

[10] The process for producing a fluorinated crosslinked product according to any one of [1] to [8], wherein the fluorinated polymer has a mass average molecular weight of from 20,000 to 200,000.

[11] The process for producing a fluorinated crosslinked product according to any one of [1] to [10], wherein the fluorinated polymer has —COZ¹ in the formula (1) in an amount of from 0.1 to 4 mmol/g.

[12] The process for producing a fluorinated crosslinked product according to any one of [1] to [11], wherein the fluorinated crosslinked product has a transmittance at a wavelength of 365 nm being at least 70% in a film having a thickness of 0.5 mm.

[13] A light emitting device encapsulated in a light-transmitting manner with a fluorinated crosslinked product obtained by the process as defined in any one of [1] to [12].

[14] The light emitting device according to [13], which is UV-LED.

Advantageous Effects of Invention

According to the present invention, it is possible to provide a process for producing a fluorinated crosslinked product which produces less HF and is excellent in stability.

DESCRIPTION OF EMBODIMENTS

Now, embodiments of the present invention will be described below, but the present invention is by no means restricted thereto.

In this specification, a compound represented by the formula (a) will be sometimes referred to as a compound (a). The same applies to compounds and units represented by other formulae.

In this specification, "encapsulation in a light-transmitting manner" means encapsulation with both light-transmitting function and encapsulation function.

In this specification, "unit" in a polymer means a unit derived from a monomer formed by polymerization of the monomer.

In this specification, a group having a carbon atom chain, such as a fluoroalkyl group, a fluoroalkylene group, a fluoroalkoxy group or a fluoroalkenyl group, may be linear or branched.

In this specification, "fluoroalkyl group" means a group in which at least one hydrogen atom in an alkyl group is substituted by a fluorine atom. The proportion of the fluorine atom in the fluoroalkyl group is preferably at least 50%, particularly preferably 100%, that is a perfluoroalkyl group, when calculated as (number of fluorine atoms in the fluoroalkyl group)/(number of hydrogen atoms in an alkyl group having the same number of carbon atoms corresponding to the fluoroalkyl group). The same applies to a fluoroalkylene group, a fluoroalkoxy group and a fluoroalkenyl group, and a perfluoroalkylene group, a perfluoroalkoxy group and a perfluoroalkenyl group are preferred.

In this specification, "curing" means curing by means of crosslinking, unless otherwise specified.

[Fluorinated Crosslinked Product]

The fluorinated crosslinked product of the present invention is produced by irradiating a fluorinated polymer having a unit represented by the following formula (1) (hereinafter, also referred to as "unit (1)"), with active energy rays having a wavelength of from 150 to 300 nm:

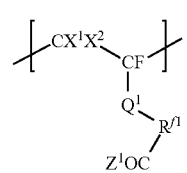
(1)

wherein $X^1$ and $X^2$ are each independently a hydrogen atom or a fluorine atom, $R^{f1}$ is a fluoroalkylene group or a fluoroalkylene group having at least two carbon atoms and an etheric oxygen atom between carbon-carbon atoms, $Q^1$ is a single bond or an etheric oxygen atom, and $Z^1$ is OH, OR¹ or NR²R³, wherein $R^1$ is an alkyl group, and $R^2$ and $R^3$ are each independently a hydrogen atom or an alkyl group.

(Fluorinated Polymer)

The fluorinated polymer used in the present invention has the unit (1). The fluorinated polymer used in the present invention may further have a unit having an alicyclic structure in its main chain (hereinafter, also referred to as "unit (2)"), a unit derived from fluoroethylene (hereinafter, also referred to as "unit (3)"), a unit represented by the formula (4) as mentioned below (hereinafter, also referred to as "unit (4)"), or another unit (hereinafter, also referred to as "unit (5)").

<Unit Represented by the Following Formula (1) (Unit (1))>

In the unit (1), when $R^{f1}$ is a fluoroalkylene group, the number of carbon atoms is preferably from 1 to 6, particularly preferably from 1 to 4. When the number of carbon atoms is at least 3, a linear structure is preferred in view of thermal stability. The fluoroalkylene group is preferably a perfluoroalkylene group in view of excellent thermal stability. That is, $R^{f1}$ is preferably a $C_{1-6}$ perfluoroalkylene group, particularly preferably a $C_{1-4}$ perfluoroalkylene group.

In the unit (1), when $R^{f1}$ is a fluoroalkylene group having at least two carbon atoms and an etheric oxygen atom between carbon-carbon atoms, the number of carbon atoms is preferably from 2 to 10, particularly preferably from 2 to 6. When the number of carbon atoms is at least 3, a linear structure is preferred in view of thermal stability. The fluoroalkylene group is preferably a perfluoroalkylene group in view of excellent thermal stability. That is, $R^{f1}$ is preferably a $C_{2-10}$ perfluoroalkylene group having an etheric oxygen atom between carbon-carbon atoms, particularly preferably a $C_{2-6}$ perfluoroalkylene group having an etheric oxygen atom between carbon-carbon atoms.

In the unit (1), $Q^1$ is preferably an etheric oxygen atom.

In the unit (1), $Z^1$ is preferably $OR^1$ in view of excellent fluidity of the fluorinated polymer when heated. $R^1$ is preferably a $C_{1-6}$ alkyl group, particularly preferably a $C_{1-2}$ alkyl group, in view of excellent fluidity of the fluorinated polymer when heated. Further, each of $R^2$ and $R^3$ is preferably a hydrogen atom or a $C_{1-6}$ alkyl group, particularly preferably a hydrogen atom or a $C_{1-2}$ alkyl group, in view of excellent fluidity of the fluorinated polymer when heated.

As specific examples of the unit (1), the following units may be mentioned.

—[CF$_2$—CF(O(CF$_2$)$_2$COOCH$_3$)]—,
—[CF$_2$—CF(O(CF$_2$)$_3$COOCH$_3$)]—,
—[CF$_2$—CF(O(CF$_2$)$_4$COOCH$_3$)]—,
—[CF$_2$—CF(O(CF$_2$)$_5$COOCH$_3$)]—,
—[CF$_2$—CF(OCF$_2$CF(CF$_3$)O(CF$_2$)$_2$COOCH$_3$)]—,
—[CF$_2$—CF(OCF$_2$CF(CF$_3$)O(CF$_2$)$_3$COOCH$_3$)]—,
—[CF$_2$—CF(O(CF$_2$)$_3$O(CF$_2$)$_2$COOCH$_3$)]—,
—[CF$_2$—CF(O(CF$_2$)$_2$O(CF$_2$)$_2$COOCH$_3$)]—,
—[CH$_2$—CF(CF$_2$OCF(CF$_3$)COOCH$_3$)]—,
—[CH$_2$—CF(CF$_2$OCF(CF$_3$)CF$_2$OCF(CF$_3$)COOCH$_3$)]—.

Among them, —[CF$_2$—CF(O(CF$_2$)$_3$COOCH$_3$)]— or —[CF$_2$—CF(OCF$_2$CF(CF$_3$)O(CF$_2$)$_3$COOCH$_3$)]— is preferred in view of availability.

The unit (1) may be one type or a combination of two or more types.

The unit (1) may be formed by polymerizing, as a monomer, a compound represented by the following formula (11):

$$CX^1X^2=CF-Q^1-R^{f1}-COZ^1 \quad (11)$$

(wherein $X^1$, $X^2$, $Q^1$, $R^{f1}$ and $Z^1$ are the same as in the formula (1), and examples and preferred range are also the same as in the formula (1).)

<Unit (2) having Alicyclic Structure in its Main Chain (Unit (2))>

In the present invention, "an alicyclic structure" in the polymer means a cyclic structure having a cyclic structure constituted solely of carbon atoms or constituted of carbon atoms and other atoms, and having no delocalized unsaturated double bond. Such other atoms are not particularly limited, but may be an oxygen atom or a nitrogen atom, and preferably an oxygen atom. A number of atoms constituting one ring may be from 4 to 8, preferably 5 to 7.

The unit (2) may be one type or a combination of two or more types.

Further, the unit having an alicyclic structure in its main chain is preferably a perfluoro unit.

The unit (2) may be a unit based on a cyclic fluorinated monomer or a unit formed by cyclic polymerization of a diene-based fluorinated monomer, and preferably a unit formed by cyclic polymerization of a diene-based fluorinated monomer.

"A cyclic fluorinated monomer" is a monomer having a polymerizable double bond between carbon atoms constituting a fluorinated aliphatic ring, or a monomer having a polymerizable double bond between a carbon atom constituting a fluorinated aliphatic ring and a carbon atom out of the fluorinated aliphatic ring. The cyclic fluorinated monomer is not particularly limited so long as it is a monomer to form the unit (2), but is preferably a compound represented by the following formula (21) or (22) (hereinafter, also referred to as "compound (21)" or "compound (22)"):

(21)

(22)

wherein $X^5$, $X^6$, $X^7$, $X^8$, $Y^3$ and $Y^4$ are each independently a fluorine atom, a perfluoroalkyl group which may have an etheric oxygen atom between carbon-carbon atoms or a perfluoroalkoxy group which may have an etheric oxygen atom between carbon-carbon atoms. $X^7$ and $X^8$ may be bonded to each other to form a fluorinated aliphatic ring.

The perfluoroalkyl group in each of $X^5$, $X^6$, $X^7$, $X^8$, $Y^3$ and $Y^4$ is preferably a $C_{1-7}$ perfluoroalkyl group, particularly preferably a $C_{1-4}$ perfluoroalkyl group. The perfluoroalkyl group is preferably linear. As a specific example, —CF$_3$, —CF$_2$CF$_3$ or —(CF$_2$)$_2$CF$_3$ may be mentioned, and —CF$_3$ is particularly preferred.

The perfluoroalkoxy group in each of $X^5$, $X^6$, $X^7$, $X^8$, $Y^3$ and $Y^4$ may be the above perfluoroalkyl group having an oxygen atom (—O—) bonded thereto, particularly preferably —OCF$_3$.

When the above perfluoroalkyl group or perfluoroalkoxy group has at least two carbon atoms, the perfluoroalkyl group or perfluoroalkoxy group may have an etheric oxygen atom (—O—) between carbon-carbon atoms.

In the formula (21), $X^5$ is preferably a fluorine atom.

In the formula (21), $X^6$ is preferably a fluorine atom, a trifluoromethyl group or a $C_{1-4}$ perfluoroalkoxy group, particularly preferably a fluorine atom or —OCF$_3$.

In the formula (21), $X^7$ and $X^8$ are each independently a fluorine atom or a $C_{1-4}$ perfluoroalkyl group, particularly preferably a fluorine atom or —CF$_3$.

In the formula (21), $X^7$ and $X^8$ may be bonded to each other to form a fluorinated aliphatic ring. Some of atoms constituting the fluorinated aliphatic ring may be oxygen atoms, and this fluorinated aliphatic ring may have a substituent such as a perfluoroalkyl group. Further, this fluorinated aliphatic ring preferably has no polymerizable double bond. The number of atoms constituting a fluorinated aliphatic ring skeleton formed by $X^7$ and $X^8$, is preferably from 4 to 7, particularly preferably from 5 to 6.

As preferred specific examples of the compound (21), the following compounds (21-1) to (21-5) may be mentioned.

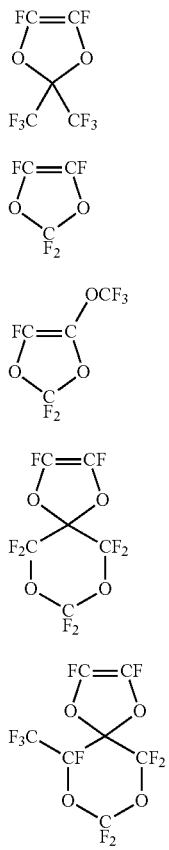

(21-1)

(21-2)

(21-3)

(21-4)

(21-5)

In the formula (22), $Y^3$ and $Y^4$ are each independently a fluorine atom, a $C_{1-4}$ perfluoroalkyl group or a $C_{1-4}$ perfluoroalkoxy group, particularly preferably a fluorine atom or —$CF_3$.

As preferred specific examples of the compound (22), the following compounds (22-1) to (22-2) may be mentioned.

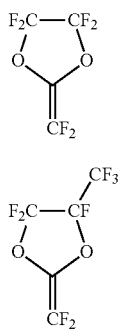

(22-1)

(22-2)

The compounds (21) and (22) may, respectively, be used alone or two or more may be used in combination.

"A diene-based fluorinated monomer" is a monomer containing a fluorine atom and two groups having a polymerizable double bond. The group having a polymerizable double bond is not particularly limited, but is preferably e.g. a vinyl group, an allyl group, an acryloyl group or a methacryloyl group where some or all of hydrogen atoms may be substituted by fluorine atoms. The diene-based fluorinated monomer is preferably a perfluorodiene-based monomer.

The diene-based fluorinated monomer is not particularly limited, but is preferably a compound represented by the following formula (23) (hereinafter, also referred to as "compound (23)"):

$$CF_2=CF-Q^2-CF=CF_2 \qquad (23)$$

wherein $Q^2$ is a $C_{1-5}$ perfluoroalkylene group, preferably a $C_{1-3}$ perfluoroalkylene group, which may have an etheric oxygen atom, and in which some of fluorine atoms may be substituted by halogen atoms other than fluorine atoms. The halogen atoms other than fluorine may, for example, be a chlorine atom or a bromine atom.

$Q^2$ is preferably a perfluoroalkylene group having an etheric oxygen atom. In such a case, the etheric oxygen atom in the perfluoroalkylene group may be present at one or both ends or between carbon atoms of the perfluoroalkylene group, but is preferably present at one end of the group in terms of cyclic polymerizability.

As specific examples of the compound (23), the following compounds may be mentioned.

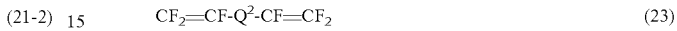

$CF_2=CFOCF_2CF=CF_2$, $CF_2=CFOCF(CF_3)CF=CF_2$, $CF_2=CFOCF_2CF_2CF=CF_2$, $CF_2=CFOCF_2CF(CF_3)CF=CF_2$, $CF_2=CFOCF(CF_3)CF_2CF=CF_2$, $CF_2=CFOCFClCF_2CF=CF_2$, $CF_2=CFOCCl_2CF_2CF=CF_2$, $CF_2=CFOCF_2OCF=CF_2$, $CF_2=CFOC(CF_3)_2OCF=CF_2$, $CF_2=CFOCF_2CF(—OCF_3)CF=CF_2$ or $CF_2=CFCF_2OCF_2CF=CF_2$.

The compound (23) may be used alone or two or more may be used in combination.

As a unit formed by cyclic polymerization of the compound (23), the following units (2-1) to (2-4) may, for example, be mentioned:

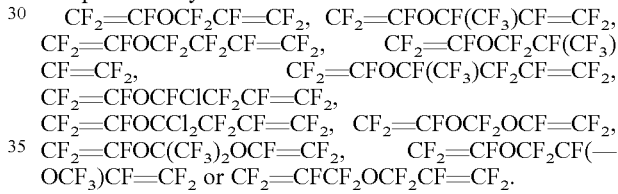

(2-1)

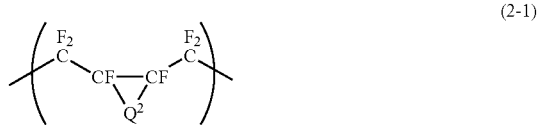

(2-2)

(2-3)

(2-4)

wherein $Q^2$ is the same as in the formula (23), and examples and a preferred range are also the same as in the formula (23).

The unit (2) in the present invention is preferably at least one type of unit selected from the group consisting of the units (2-1) to (2-4) in view of production easiness and thermal stability.

<Unit Derived from Fluoroethylene (Unit (3))>

In the present invention, "fluoroethylene" means a compound in which from 0 to 3 fluorine atoms in tetrafluoroethylene ($CF_2=CF_2$) are substituted by hydrogen atoms or halogen atoms other than fluorine. The unit (3) is not particularly limited, but is a unit derived from e.g. tetrafluoroethylene ($CF_2=CF_2$), trifluoroethylene ($CF_2=CHF$), chlorotrifluoroethylene ($CFCl=CF_2$) or vinylidene fluoride ($CF_2=CH_2$). The unit (3) is preferably a unit derived from tetrafluoroethylene, trifluoroethylene or chlorofluoroethylene in view of excellent light resistance, particularly preferably a unit derived from tetrafluoroethylene in view of thermal stability.

The unit (3) may be used alone or two or more may be used in combination.

<Unit Represented by Formula (4) (Unit (4))>

The unit (4) is a unit represented by the following formula (4):

$$—[CX^3X^4—CY^1Y^2]—  \quad (4)$$

wherein $X^3$ and $X^4$ are each independently a hydrogen atom, a fluorine atom or a chlorine atom, $Y^1$ is a hydrogen atom, a fluorine atom or a chlorine atom, and $Y^2$ is a hydrogen atom, a fluoroalkyl group which may have an etheric oxygen atom between carbon-carbon atoms, a fluoroalkoxy group which may have an etheric oxygen atom between carbon-carbon atoms, or a fluoroalkenyl group which may have an etheric oxygen atom between carbon-carbon atoms.

In the formula (4), when $Y^2$ is a fluoroalkyl group which may have an etheric oxygen atom between carbon-carbon atoms, the number of carbon atoms is preferably from 1 to 15, particularly preferably from 1 to 6. Further, the fluoroalkylene group is preferably a perfluoroalkylene group in view of thermal stability. The fluoroalkyl group which may have an etheric oxygen atom between carbon-carbon atoms is more preferably a $C_{1-6}$ perfluoroalkyl group which may have no etheric oxygen atom, such as —$CF_3$.

When $Y^2$ is a fluoroalkoxy group which may have an etheric oxygen atom between carbon-carbon atoms, the number of carbon atoms is preferably from 1 to 15, particularly preferably from 1 to 6. Further, the fluoroalkoxy group is preferably a perfluoroalkoxy group in view of thermal stability. The fluoroalkoxy group which may have an etheric oxygen atom between carbon-carbon atoms is more preferably a $C_{1-6}$ perfluoroalkoxy group which has no etheric oxygen atom, such as —$OCF_3$, —$OCF_2CF_3$, —$O(CF_2)_2CF_3$ or —$O(CF_2)_3CF_3$.

When $Y^2$ is a fluoroalkenyl group which may have an etheric oxygen atom between carbon-carbon atoms, the number of carbon atoms is preferably from 5 to 15. Further, the fluoroalkenyl group is preferably a perfluoroalkenyl group in view of thermal stability. The fluoroalkenyl group which may have an etheric oxygen atom between carbon-carbon atoms is more preferably a $C_{5-15}$ fluoroalkenyl group which may have no etheric oxygen atom, such as —$(CF_2)_4CF=CF_2$, —$(CF_2)_5CF=CF_2$ or —$(CF_2)_6CF=CF_2$. When the fluoroalkenyl group has at least 5 carbon atoms, a cyclization reaction fails to proceed in the molecule, whereby synthesis is easy.

As specific examples of the unit (4), the following units may be mentioned.

—[$CH_2$—$CH_2$]—, —[$CF_2$—$CF(CF_3)$]—, —[$CH_2$—$CF(CF_3)$]—, —[$CF_2$—$CF(OCF_3)$]—, —[$CF_2$—$CF(OCF_2CF_3)$]—, —[$CF_2$—$CF(O(CF_2)_2CF_3)$]—, —[$CF_2$—$CF(O(CF_2)_3CF_3)$]—, —[$CF_2$—$CF((CF_2)_4CF=CF_2)$]—, —[$CF_2$—$CF((CF_2)_5CF=CF_2)$]— or —[$CF_2$—$CF((CF_2)_6CF=CF_2)$]—.

Among them, a unit derived from a perfluoromethyl vinyl ether, a unit derived from a perfluoropropyl vinyl ether, a unit derived from hexafluoropropene or a unit derived from ethylene is preferred from the viewpoint that high moldability can be achieved by the increase of flowability and the reduction of glass transition temperature, and that high intermolecular crosslinking reactivity can be achieved by enhancement of mobility at the time of UV crosslinking.

The unit (4) may be used alone or two or more may be used in combination.

The unit (4) may be formed by polymerizing the compound (41) as a monomer:

$$CX^3X^4=CY^1Y^2 \quad (41)$$

wherein $X^3$, $X^4$, $Y^1$ and $Y^2$ are the same as in the formula (4), and examples and a preferred range are also the same as in the formula (4).

<Combination of Preferred Units>

In all the units of the fluorinated polymer used in the present invention, the proportion of the unit (1) is preferably from 3 to 100 mol %, more preferably from 3 to 50 mol %, particularly preferably from 5 to 15 mol %. When the proportion of the unit (1) is the upper limit or lower of the above range, bubbling in the crosslinked product tends to be suppressed without curing on the surface only.

In the present invention, the content of the units (1) to (5) in the fluorinated polymer can be calculated by $^{19}F$—NMR or $^1H$—NMR measurement. Further, in the fluorinated polymer, the concentration of the group represented by —$COZ^1$ in the unit (1) may be calculated by $^{19}F$—NMR measurement. Further, when the fluorinated polymer is a perfluoro polymer, the concentration can be calculated in such a manner that the —$COZ^1$ group is hydrolyzed with sodium hydroxide to obtain —COONa, and remaining sodium hydroxide is subjected to titration.

As a preferred embodiment of the fluorinated polymer in the present invention, the following embodiments (A) to (D) may be mentioned.

(A) A fluorinated polymer containing the unit (1) and the unit (2). In all the units of the fluorinated polymer used in the present invention, the proportion of the unit (1) is from 99 to 3 mol %, and the proportion of the unit (2) is from 1 to 97 mol %.

(B) A fluorinated polymer containing the unit (1), the unit (2) and the unit (3). In all the units of the fluorinated polymer used in the present invention, the proportion of the unit (1) is from 98 to 3 mol %, the proportion of the unit (2) is from 1 to 96 mol %, and the proportion of the unit (3) is from 1 to 70 mol %.

(C) A fluorinated polymer containing the unit (1), the unit (2) and the unit (4). In all the units of the fluorinated polymer used in the present invention, the proportion of the unit (1) is from 98 to 3 mol %, the proportion of the unit (2) is from 1 to 96 mol %, and the proportion of the unit (4) is from 1 to 96 mol %.

(D) A fluorinated polymer containing the unit (1), the unit (2), the unit (3) and the unit (4). In all the units of the fluorinated polymer used in the present invention, the proportion of the unit (1) is from 97 to 3 mol %, the proportion of the unit (2) is from 1 to 95 mol %, the proportion of the unit (3) is from 1 to 95 mol %, and the proportion of the unit (4) is from 1 to 95 mol %.

The concentration of the group represented by —COZ$^1$ in the fluorinated polymer used in the present invention is preferably from 0.1 to 4 mmol/g, more preferably from 0.1 to 3 mmol/g, particularly preferably from 0.3 to 1 mmol/g, based on the mass of the fluorinated polymer. When the concentration of the group represented by —COZ$^1$ is the lower limit or higher, a crosslinking reaction may properly proceed, and when it is the upper limit or lower of the above range, bubbling in the crosslinked product tends to be suppressed without curing on the surface only.

(Molecular Weight of Fluorinated Polymer)

The fluorinated polymer has a mass average molecular weight of preferably from 3,000 to 200,000. In such a range, when the fluorinated polymer has a mass average molecular weight of at most 10,000, the viscosity is from 1 to 10,000 Pa·s, and when heated to a temperature of from 25 to 100° C., the viscosity becomes 10 Pa·s or lower, whereby the fluorinated polymer flows because of its own weight. If the mass average molecular weight exceeds 10,000, the fluorinated polymer has such a high viscosity of at least 10,000 Pa·s at 25° C., and thereby requires heating of from 100 to 150° C. so as to allow it flow. Further, if the mass average molecular weight exceeds 20,000, compression of from 0.1 to 10 MPa is required to allow it flow.

In a case where the fluorinated polymer is molded by e.g. cast molding, the mass average molecular weight of the fluorinated polymer is preferably from 3,000 to 20,000, particularly preferably from 5,000 to 15,000. When the mass average molecular weight of the fluorinated polymer is the lower limit or higher of the above range, the mechanical strength or the heat resistance of the crosslinked cured product tends to be excellent, and when the mass average molecular weight is the upper limit or lower of the above range, the fluidity tends to be secured during molding. In particular, the fluidity is of importance for encapsulating an SMD type (a LED module provided with a cup-shaped reflector), and therefore a fluorinated polymer having a mass average molecular weight within this range is preferred.

In a case where a molded product such as a fluorinated polymer sheet is used as processed, the fluorinated polymer has a mass average molecular weight of preferably from 20,000 to 200,000, particularly preferably from 30,000 to 100,000. For example, for encapsulating a COB type (an LED module having no reflector, a plurality of devices are subjected to batch encapsulation with an encapsulating resin), there is a case where a sheet-shaped encapsulating resin is used for heat encapsulation. In such a case, a sheet-shaped fluorinated polymer is laminated on a substrate mounted with an LED device, and the fluorinated polymer is heated to from 100 to 150° C. and is thereby allowed to flow so as to cover the device, followed by UV curing to carry out encapsulation. At that time, in order to carry out the encapsulation without leaving a space or bubbles, it is preferred to cover the device with the sheet while carrying out compression. When the mass average molecular weight is at least 20,000, the fluorinated polymer does not flow and keeps its shape at room temperature and has no stickiness, and is thereby easily handled, and further it is possible to let it flow by compression under heating so as to encapsulate an LED device. When the mass average molecular weight is at most 200,000, the temperature required for fluidization will not be too high, whereby it is possible to avoid unfavorable influence on e.g. the device.

The mass average molecular weight can be determined as a molecular weight calculated as PMMA (polymethyl methacrylate) by gel permeation chromatography (GPC).

(Process for Producing Fluorinated Polymer)

The fluorinated polymer may be obtained by polymerizing a monomer forming the above unit by a known polymerization method, such as suspension polymerization, solution polymerization, emulsion polymerization or bulk polymerization. Solution polymerization is preferred from the viewpoint that the molecular weight can easily be controlled to a specific degree.

A polymerization medium for the solution polymerization is preferably a fluorinated solvent which dissolves a fluorinated polymer to be produced. The fluorinated solvent is a solvent containing fluorine and carbon, and containing chlorine, oxygen and hydrogen as the case requires, such as dichloropentafluoropropane (HCFC-225), $CF_3CH_2CF_2H$ (HFC-245fa), $CF_3CF_2CH_2CF_2H$ (HFC-365mfc), perfluorohexane, 1H-perfluorohexane, perfluorooctane or perfluoro (2-butyltetrahydrofuran). As dichloropentafluoropropane, AK-225 (manufactured by Asahi Glass Company, Limited) may be mentioned as a commercial product.

As a polymerization initiator to be used for polymerization reaction, an organic peroxide or an organic azo type polymerization initiator, having a ten-hour half-life temperature of from 20 to 120° C., may, for example, be employed.

The organic peroxide may be a peroxydicarbonate. As specific examples of the peroxydicarbonate, the following compounds may be mentioned. Diisopropyl peroxydicarbonate (ten-hour half-life temperature: 40.5° C.), dicyclohexyl peroxydicarbonate, bis(4-t-butylcyclohexyl)peroxydicarbonate (ten-hour half-life temperature: 40.8° C.), di-sec-butyl peroxydicarbonate (ten-hour half-life temperature: 40.5° C.), di-2-ethylhexyl peroxydicarbonate (10-hour half-life temperature: 43.6° C.), dibenzyl peroxydicarbonate and a compound represented by $(CH_3(CH_2)_nCH_2OC(O)O)_2$ wherein n is from 1 to 10. As a commercial product of the peroxydicarbonate, PEROYL TCP (bis(4-t-butylcyclohexyl) peroxydicarbonate, manufactured by NOF Corporation) may, for example, be mentioned.

As specific examples of the organic azo-type polymerization initiator, the following compounds may be mentioned. 2,2'-Azobis(4-methoxy-2,4-dimethylvaleronitrile) ("V-70" manufactured by Wako Pure Chemical Industries, Ltd.; ten-hour half-life temperature: 30° C.), 2,2'-azobis(2,4-dimethylvaleronitrile) ("V-65" manufactured by Wako Pure Chemical Industries, Ltd.; ten-hour half-life temperature: 51° C.), 2,2'-azobis(2-methylpropionitrile) ("V-60" manufactured by Wako Pure Chemical Industries, Ltd.; ten-hour half-life temperature: 65° C.), 2,2'-azobis(2-m ethylbutyronitrile) ("V-59" manufactured by Wako Pure Chemical Industries, Ltd.; ten-hour half-life temperature: 67° C.), dimethyl 2,2'-azobis(2-methylpropionate) ("V-601" manufactured by Wako Pure Chemical Industries, Ltd.: ten-hour half-life temperature: 66° C.).

The concentration of the polymerization initiator is preferably from 0.1 to 5 mass %, based on the total amount of the monomer. The polymerization temperature is selected by the ten-hour half-life temperature of the initiator and the polymerization rate of the monomer, and is preferably from 20 to 120° C., particularly preferably from 40 to 90° C.

In the polymerization reaction, it is preferred to use a chain transfer agent. The chain transfer agent may be a chlorine compound, such as $CCl_4$, $CH_3Cl$, $SO_2Cl_2$ or $CHFCl_2$, or a hydrocarbon compound, such as methanol, ethanol, isopropanol, hexane or diethyl ether. $SO_2Cl_2$ is particularly preferred in view of excellent chain transfer efficiency and from the viewpoint that a fluorinated polymer can be obtained in high yield.

The amount of the chain transfer agent to be used varies depending on the chain transfer constant, but when $SO_2Cl_2$ is used, the amount is preferably from 0.1 to 10 (molar ratio) based on the total amount of the monomer. If the amount of the chain transfer agent is too small, the molecular weight of the fluorinated polymer tends to be too high. If the amount of the chain transfer agent is too large, the molecular weight of the fluorinated polymer tends to be too low.

Further, the resulting fluorinated polymer may be subjected to cleaning treatment with an alcohol such as methanol, whereby a —COF group present at the end of the polymer may be converted to a —COOR$^1$ group.

<Crosslinkable Composition, Coating Composition>

The fluorinated crosslinked product of the present invention may be produced by using only the above fluorinated polymer, or may be produced from a crosslinkable composition containing the fluorinated polymer, a coating composition having a solvent further added to the fluorinated polymer or a coating composition having a solvent further added to the crosslinkable composition.

The crosslinkable composition of the present invention may contain e.g. a silane coupling agent as a component other than the fluorinated polymer as an essential component.

As specific examples of the silane coupling agent, the following compounds may be mentioned.

Tetraethoxysilane, 3-glycidoxypropyl trimethoxysilane, methyl trimethoxysilane, vinyl trimethoxysilane, 3-methacryloyloxypropyl trimethoxysilane, 3-chloropropyl trimethoxysilane, 3-mercaptopropyl trimethoxysilane, 3-aminopropyl triethoxysilane, heptadecafluorooctylethyl trimethoxysilane, CH$_2$=CHC$_4$F$_8$CH$_2$CH$_2$Si(OC$_2$H$_5$)$_3$, CH$_2$=CHC$_6$F$_{12}$CH$_2$CH$_2$Si(OC$_2$H$_5$)$_3$, CH$_2$=CHC$_4$F$_8$CH$_2$CH$_2$Si(OCH$_3$)$_3$, CH$_2$=CHC$_6$F$_{12}$CH$_2$CH$_2$Si(OCH$_3$)$_3$, CH$_2$=CHCH$_2$C$_4$F$_8$CH$_2$CH$_2$CH$_2$Si(OC$_2$H$_5$)$_3$, CH$_2$=CHCH$_2$C$_6$F$_{12}$CH$_2$CH$_2$CH$_2$Si(OC$_2$H$_5$)$_3$, CH$_2$=CHCH$_2$C$_4$F$_8$CH$_2$CH$_2$CH$_2$Si(OCH$_3$)$_3$, CH$_2$=CHCH$_2$C$_6$F$_{12}$CH$_2$CH$_2$CH$_2$Si(OCH$_3$)$_3$, (C$_2$H$_5$O)$_3$SiCH$_2$CH$_2$C$_4$F$_8$CH$_2$CH$_2$Si(OC$_2$H$_5$)$_3$, (C$_2$H$_5$O)$_3$SiCH$_2$CH$_2$C$_6$F$_{12}$CH$_2$CH$_2$Si(OC$_2$H$_5$)$_3$, (CH$_3$O)$_3$SiCH$_2$CH$_2$C$_4$F$_8$CH$_2$CH$_2$Si(OCH$_3$)$_3$, (CH$_3$O)$_3$SiCH$_2$CH$_2$C$_6$F$_{12}$CH$_2$CH$_2$Si(OCH$_3$)$_3$, (C$_2$H$_5$O)$_3$SiCH$_2$CH$_2$C$_4$F$_8$CH$_2$CH$_2$CH$_2$Si(OC$_2$H$_5$)$_3$, (C$_2$H$_5$O)$_3$SiCH$_2$CH$_2$C$_6$F$_{12}$CH$_2$CH$_2$CH$_2$Si(OC$_2$H$_5$)$_3$, (CH$_3$O)$_3$SiCH$_2$CH$_2$C$_4$F$_8$CH$_2$CH$_2$CH$_2$Si(OCH$_3$)$_3$ and (CH$_3$O)$_3$SiCH$_2$CH$_2$C$_6$F$_{12}$CH$_2$CH$_2$CH$_2$Si(OCH$_3$)$_3$.

The content of the silane coupling agent is preferably from 0.1 to 3 mass % to the fluorinated polymer. When the content of the silane coupling agent is at least 0.1 mass % to the fluorinated polymer, the adhesion to a substrate of a fluorinated crosslinked product may improve, and when the content is at most 3 mass %, it is possible to suppress turbidity, whereby energy ray irradiation tends not to be inhibited.

The crosslinkable composition in the present invention may contain a fluoropolyether compound having a group represented by the following formula (6) (hereinafter also referred to as "group (6)") and a group represented by —COZ$^1$:

$$—[C_mF_{2m}O]— \qquad (6)$$

wherein m is an integer of from 1 to 6.

When the crosslinkable composition of the present invention has a fluoropolyether compound, the fluoropolyether compound can be kept in a stably dispersed and mixed state, whereby a fluorinated crosslinked product having an excellent mechanical strength may be obtained.

The unit of —C$_m$F$_{2m}$O— in the formula (6) may be linear or branched, and may, for example, be —CF$_2$CF$_2$CF$_2$CF$_2$CF$_2$CF$_2$O—,  —CF$_2$CF$_2$CF$_2$CF$_2$CF$_2$CF$_2$CF$_2$O—, —CF$_2$CF$_2$CF$_2$CF$_2$O—, —CF$_2$CF$_2$CF$_2$O—, —CF(CF$_3$)CF$_2$O—, —CF$_2$CF$_2$O— or —CF$_2$O—, and in view of excellent production easiness, chemical durability and ultraviolet resistance, —CF$_2$CF$_2$O— is preferred.

(Process for Producing Fluorinated Crosslinked Product)

The fluorinated crosslinked product is preferably produced by preparing a molded product made of the fluorinated polymer or a molded product made of the crosslinkable composition containing the fluorinated polymer, and then irradiating the molded product with active energy rays. A crosslinking reaction is carried out by irradiation with active energy rays, and therefore it is possible to obtain a fluorinated crosslinked product at a temperature lower than a method wherein crosslinking reaction is carried out by heating. Further, the irradiation with active energy rays is preferred since a type of a substrate, especially the heat resistance of a substrate is not restricted in e.g. a case where a crosslinking reaction is carried out on the substrate.

<Process for Producing Molded Product>

A process for producing a molded product is divided into a process for producing a molded product without using a solvent or a process for producing a molded product using a solvent.

The process for producing a molded product without using a solvent, may, for example, be a process wherein the fluorinated polymer containing no solvent or the crosslinkable composition containing no solvent is made to flow, by heating as the case requires, and is poured into a mold to form a prescribed shape or casted onto the surface of a mold to form a sheet or a film. Further, e.g. extrusion or transfer molding may be carried out to mold it into a prescribed shape. Moreover, the molded sheet or film may be cut or bent into a prescribed shape to carry out fabricating. In production of a fluorinated crosslinked product integrated with a substrate, the substrate is used as the above mold to carry out molding, and the resulting molded product is crosslinked without separating the molded product from the substrate to produce the fluorinated crosslinked product integrated with the substrate. Furthermore, according to fabrication such as a method of laminating a molded sheet or film on a substrate and pressing it into a laminate, it is possible to produce a fluorinated crosslinked product integrated with the substrate.

The process for producing a molded product using a solvent, that is a process for producing a molded product using the above-mentioned coating composition is particularly suitable for producing a thin-film molded product or a thin-film molded product integrated with a substrate. The fluorinated polymer dissolved in a solvent or the crosslinkable composition containing a solvent may be formed into a low-viscous liquid, this liquid may be applied on a mold or a substrate to form a thin film, and the solvent is removed to easily produce a thin-film molded product. The viscosity of the coating composition may easily be adjusted, and the thickness of the thin film may easily be controlled in accordance with the viscosity.

The solvent is preferably one exemplified as a polymerization medium in solution polymerization for producing the fluorinated polymer. Although the content of the solvent is not particularly limited, it is preferred that the proportion of the fluorinated polymer is from 1 to 99 mass %, and the proportion of the solvent is from 99 to 1 mass %, based on the total (100 mass %) of the fluorinated polymer and the solvent.

The coating method may, for example, be a spin coating method, a wipe coating method, a spray coating method, a squeegee coating method, a dip coating method, a die coating method, an ink jetting method, a flow coating method, a roll coating method, a casting method, a Langmuir-Blodgett method, or a gravure coating method.

The amount (thickness) of the fluorinated polymer or the crosslinkable composition to be applied is not particularly limited so long as a molded product or a coating as mentioned below may be formed. For example, in the case of forming a coating of the fluorinated polymer or the crosslinkable composition, it is preferably from 1 to 500 µm, particularly preferably from 5 to 100 µm. When the thickness of the coating is at least the lower limit of the above range, the resulting fluorinated crosslinked product tends to be excellent in durability, and when it is at most the upper limit of the above range, the fluorinated polymer tends to sufficiently undergo crosslinking reaction.

Here, in the case of using a coating composition, it is preferred that a solvent is sufficiently removed before irradiation with energy rays and after applying the coating composition on a substrate. By sufficiently removing the solvent before irradiation with energy rays, the fluorinated crosslinked product tends to be free from volume shrinkage due to volatilization of the solvent during and after crosslinking, whereby occurrence of stress on a device encapsulated in a light-transmitting manner with the fluorinated crosslinked product or delamination of the fluorinated crosslinked product tends to be suppressed. As a method of removing the solvent, a method of heating, reducing the pressure or heating to reduce the pressure may be mentioned.

In a case where the fluorinated polymer of the present invention is preliminarily molded into a sheet to be used for encapsulation of a LED, the sheet is formed on the surface of a mold of e.g. a glass plate or a support film, and then only one side is irradiated with UV as the case requires so as to be in a semi-cured condition, whereby it is possible to shorten a curing time or avoid a problem such as stickiness during handling of the sheet.

<Active Energy Ray>

The active energy rays have a wavelength of from 150 to 300 nm, preferably from 200 to 260 nm. A source for generating the active energy rays may be a metal halide lamp for a wavelength of from 250 to 300 nm, a low-pressure mercury lamp for a wavelength of 185 and 254 nm, an excimer lamp for a wavelength of 172 nm and 222 nm, a KrF excimer laser for a wavelength 248 nm, an ArF excimer laser for a wavelength of 193 nm and a $F_2$ laser for a wavelength of 157 nm.

By adjusting an irradiation time depending on the irradiation intensity of the active energy rays, it is possible to produce a fluorinated crosslinked product. For example, crosslinking may be carried out at an irradiation intensity of from 0.1 to 500 mW/cm$^2$ for from about 1 minute to 10 hours. In the present invention, by irradiation with active energy rays having the above specific wavelengths, it is possible to make crosslinking reaction proceed without using a photoinitiator. Further, the fluorinated polymer of the present invention failed to undergo crosslinking reaction even when irradiated with active energy rays having a wavelength of 365 nm with the use of a photoinitiator. That is, the process for producing a fluorinated crosslinked product of the present invention is characterized by formation of a crosslinked moiety by irradiation with active energy rays having a prescribed wavelength.

(Crosslinking Reaction)

In the process for producing a fluorinated crosslinked product of the present invention, -$Q^1$-$R^{f1}$—$COZ^1$ in the unit (1) is irradiated with light having a wavelength of from 150 to 300 nm so as to produce a -$Q^1$-$R^{f1}$.radical by a $COZ^1$ removal reaction as represented by the following reaction formula [1], and intermolecular two -$Q^1$-$R^{f1}$.radicals undergo reaction to form a crosslinked moiety (-$Q^1$-$R^{f1}$—$R^{f1}$-$Q^1$-), whereby the fluorinated polymer or the crosslinkable composition is crosslinked to be cured. Here, the crosslinked moiety (-$Q^1$-$R^{f1}$—$R^{f1}$-$Q^1$-) formed by the reaction formula (1) corresponds to the crosslinked moiety in the fluorinated crosslinked product obtained by the process for producing a fluorinated crosslinked product of the present invention.

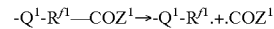

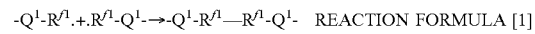    REACTION FORMULA [1]

Here, in the crosslinking reaction, all the —$COZ^1$ in the fluorinated polymer may or may not be reacted. In a case where all the —$COZ^1$ is not reacted, the resulting fluorinated crosslinked product contains —$COZ^1$.

Further, in a case where the crosslinkable composition contains a fluoropolyether compound, the fluoropolyether compound is irradiated with active energy rays, whereby it undergoes a $COZ^1$ removal reaction, whereby a group represented by —$COZ^1$ is removed from the fluoropolyether compound so as to produce a fluoropolyether radical having the group (6), and this radical is reactive with a -$Q^1$-$R^{f1}$.radical, whereby the group (6) can be bonded to a side chain or a terminal of a fluorinated crosslinked product or the fluorinated polymer.

In a case where a compound having one group represented by $COZ^1$ at a terminal and a $CF_3$ group at the other terminal is used as the fluoropolyether compound, it is possible to increase water/oil repellency or non-tackiness on the surface of the fluorinated crosslinked product of the present invention.

The crosslinking reaction by means of irradiation with light is preferably carried out under oxygen-free conditions, such as nitrogen atmosphere. If irradiation with light is carried out in the presence of oxygen, the oxygen is reacted with -$Q^1$-$R^f$. formed in the reaction formula [1] to form -$Q^1$-$R^{f1}$—OO. which may inhibit the production of the crosslinked structure -$Q^1$-$R^{f1}$—$R^{f1}$-$Q^1$-.

-$Q^1$-$R^{f1}$—OO. may be further decomposed and thereby produce —COF which may be hydrolyzed with water in air and thereby bring an adverse influence on reduction of the amount of HF produced, as an object of the present invention. Further, a —COOH group produced at the same time may also deteriorate an anti-fouling effect on the surface.

[Fluorinated Crosslinked Product]

The fluorinated crosslinked product of the present invention is obtainable by irradiating the fluorinated polymer having the unit (1) with light having a wavelength of from 150 to 300 nm. The fluorinated crosslinked product of the present invention is such that the amount of HF gas produced by heating the crosslinked product at 200° C. for 1 hour is preferably at most 3 mg/g, more preferably at most 0.5 mg/g, particularly preferably at most 0.3 mg/g to mass of the fluorinated crosslinked product. The amount of HF gas produced is determined in such a manner that a component volatilizable by heating the crosslinked product at 200° C. for 1 hour is introduced into a 1 mM aqueous NaOH solution, and the F ion concentration in the 1 mM aqueous NaOH solution is measured. Here, the F ion concentration may be calculated by measurement with ion chromatography. When the amount of HF gas produced is at most 3 mg/g to the mass of the fluorinated crosslinked product, metal corrosion due to the production of HF is reduced even after a light-emitting device is encapsulated in a light-transmitting manner.

The fluorinated crosslinked product of the present invention contains, as an UV crosslinkable moiety, only —$COZ^1$ having an absorption at a wavelength of at most 300 nm and contributing to decomposition/crosslinking reaction, but contains no other functional groups, and therefore it is possible to increase the transmissivity because of no absorption of ultraviolet rays at a wavelength of from 300 to 400 nm. Accordingly, it is useful as a light-transmitting material for encapsulating UV-LED which replaces a high-pressure mercury lamp having an emission wavelength at e.g. 313 nm, 365 nm or 405 nm. The thickness for encapsulation of an UV-LED is usually about 0.5 mm, and therefore the transmittance at 365 nm of a 0.5 mm-thick sheet is necessarily at least 70%, preferably at least 80%, particularly preferably at least 90%.

As a reason that the transmittance is less than 100%, crystallinity of the fluoroethylene unit (3) or a light scattering component based on the composition distribution is considered. In particular, when tetrafluoroethylene (TFE) is used as the unit (3), light scattering property is likely to be observed due to a crystal having TFE units continuously linked or composition distribution if polymerizability of a monomer to be combined is poor. In such a case, it is necessary to reduce the content of TFE. The content of TFE is at most 70 ml %, preferably at most 65 mol %, more preferably at most 60 mol %. In the case of trifluoroethylene or chlorotrifluoroethylene, crystallinity is not as high as TFE, and light is less likely to be scattered, whereby transparency becomes higher. Further, the unit (2) having an alicyclic structure in its main chain, which is effective for destroying the crystallinity of the fluoroethylene unit (3), has higher transparency.

[Application]

The fluorinated crosslinked product of the present invention has high stability and hardly produces HF. In addition, in a case where the fluorinated crosslinked product of the present invention has no light scattering property due to the composition distribution or the crystallinity based on continuity of the fluoroethylene units in the fluorinated copolymer, it is possible to increase the transmissivity of the ultraviolet rays at from 300 to 400 nm.

A film employing the fluorinated crosslinked product of the present invention, which has a crosslinked structure, is excellent in strength, and in a case where the group represented by —$COZ^1$ is present, the film may have carboxylic acid groups (—COOH groups) as exchange groups in an ion exchange membrane by hydrolysis. The film employing the fluorinated crosslinked product of the present invention is useful as a fluorine-based ion exchange membrane to be used for salt electrolysis or a fuel cell material.

The fluorinated crosslinked product of the present invention is excellent in transparency as compared with a conventional fluorinated polymer. Accordingly, the fluorinated crosslinked product of the present invention is useful as an optical material.

The application of the optical material may, for example, be a core material or a cladding material for an optical fiber, a core material or a cladding material for an optical guide, a pellicle material, a surface protective material for a display (such as PDP (plasma display panel), LCD (liquid crystal display), FED (field emission display) or organic EL), a surface protective material for a lens (such as a condensing lens for a light emitting device, an artificial crystalline lens, a contact lens or a low refractive index lens), a material for a lens (such as a condensing lens for a light emitting device, an artificial crystalline lens, a contact lens or a low refractive index lens), or a material for encapsulating an optical device (such as a light emitting device, a solar battery device or a semiconductor device).

The optical material of the present invention is preferably used as a molded product made of the fluorinated crosslinked product having an optional shape (such as a plate, a tube or a bar) formed by crosslinking the fluorinated polymer in a mold having an optional shape, or used so as to encapsulate an optional substrate (such as the above-mentioned display, lens or device) in a light-transmitting manner by a coating of the fluorinated crosslinked product formed by crosslinking the crosslinkable composition on the optional substrate.

The molded product is preferably a core and/or cladding material for an optical fiber, a core and/or cladding material for an optical waveguide, or a material for a lens.

The coating is preferably a material for encapsulating a device such as a semiconductor device, a solar battery device or a light emitting device (such as LED, laser diode (LD) or electroluminescence device) in a light-transmitting manner, particularly preferably a material for encapsulating a short wavelength light emitting device in a light-transmitting manner, in view of light transmissivity and light resistance. The short wavelength light emitting device may be an UV-LED or a white LED. It is particularly useful as a material for encapsulating an UV-LED used as a substitute for a high-pressure mercury lamp in an UVA region of from 315 to 400 nm, in a light-transmitting manner.

Thus, according to the present invention, it is possible to obtain a light emitting device encapsulated in a light-transmitting manner with the optical material. In a case where the light emitting device of the present invention is a short wavelength light emitting device having a wavelength of from 200 to 500 nm, e.g. a phosphor for converting a wavelength of light emitted from LED may be added to the crosslinkable composition, as the case requires.

EXAMPLES

Now, the present invention will be described in detail with reference to Examples and Comparative Examples. However, it should be understood that the present invention is by no means restricted thereto. Here, Ex. 1 to 4 and 6 to 9 are Examples of the present invention, and Ex. 5 is a Comparative Example. Each Ex. was evaluated in accordance with the following evaluation methods.

[Evaluation Method]

(Mass Average Molecular Weight of Fluorinated Polymer)

The mass average molecular weight of the fluorinated polymer was calculated as a molecular weight calculated as PMMA (polymethyl methacrylate) by gel permeation chromatography (GPC) using $CF_2ClCF_2CHClF$ (tradename: AK-225cb, manufactured by Asahi Glass Company, Limited) as a solvent.

(Content of $COOCH_3$ Group in Fluorinated Polymer)

The content of $COOCH_3$ groups in the fluorinated polymer was determined by $^{19}F$-NMR.

(Amount of HF Produced)

A film was heated at 200° C. for 1 hour to volatilize a component, which was then introduced into an alkaline solution (1 mM NaOH), and an F ion concentration in the alkaline solution was measured by means of ion chromatography (DX320 type system manufactured by DIONEX, column: IONPacAS4A-SC, mobile phase: 3 mmol/L NaHCO3) to quantitatively determine the amount of HF produced by the heating.

Production Example 1

Production of Fluorinated Polymer P1

26.2 g of $CF_2$=$CFOCF_2CF_2CF_2COOCH_3$, 23.8 g of $CF_2$=$CFOCF_2CF_2CF$=$CF_2$ (hereinafter also referred to as "BVE") and, as a polymerization initiator, 0.62 g of a $CF_2ClCF_2CHClF$ solution having 75% of diisopropyl peroxydicarbonate were charged into a 50 mL pressure-resistant glass container, and the interior of the system was replaced by nitrogen. Stirring was carried out while heating so that the internal temperature would be 40° C., to conduct polymerization reaction for 24 hours. After completion of the polymerization reaction, the interior was cooled, 2 g of methanol was added thereto, followed by stirring for 30 minutes, and then unreacted $CF_2$=$CFOCF_2CF_2CF_2COOCH_3$, BVE and $CF_2ClCF_2CHClF$ were distilled off under reduced pressure to obtain 37 g of a fluorinated polymer P1. The unit composition of the fluorinated polymer P1 was such that the proportion of unit (p1-1) derived from $CF_2$=$CFOCF_2CF_2CF_2COOCH_3$ was 47 mol %, and the proportion of unit (p1-2) derived from BVE was 53 mol %, and the mass average molecular weight was 4,900.

The above unit (p1-1) and unit (b1-2) are as follows.

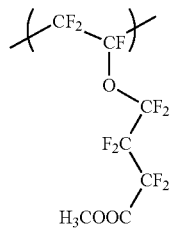

(p1-1)

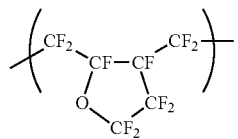

(p1-2)

Production Example 2

Production of Fluorinated Polymer P2

12.0 g of $CF_2$=$CFOCF_2F_2CF_2F_2COOCH_3$, 24.0 g of BVE, 6.0 g of $CF_2$=$CFOCF_2CF_2CF_3$ (hereinafter also referred to as "PPVE"), and 1.6 g of a $CF_2ClCF_2CHClF$ solution containing 75% of diisopropyl peroxydicarbonate as a polymerization initiator, were charged into a 50 mL pressure-resistant glass container, and the interior of the system was replaced by nitrogen. The interior was heated with stirring so that the internal temperature would be 40° C., to conduct polymerization reaction for 24 hours. After completion of the polymerization reaction, the interior of the system was cooled, 20 g of methanol was added thereto, followed by stirring for 30 minutes, and then a supernatant was removed. Further, 40 g of methanol was added thereto, followed by stirring to obtain a white precipitate. A supernatant was removed, and methanol and unreacted $CF_2$=$CFOCF_2CF_2CF_2COOCH_3$, BVE and PPVE were distilled off under reduced pressure to obtain 22 g of a fluorinated polymer P2. The unit composition of the fluorinated polymer P2 was such that the proportion of unit (p2-1) derived from $CF_2$=$CFOCF_2CF_2CF_2COOCH_3$ was 24 mol %, the proportion of unit (p2-2) derived from BVE was 64 mol %, and the proportion of unit (p2-3) derived from PPVE was 12 mol %, and the mass average molecular weight was 16,400.

The above units (p2-1), (p2-2) and (p2-3) are as follows.

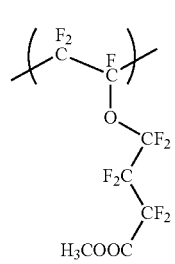

(p2-1)

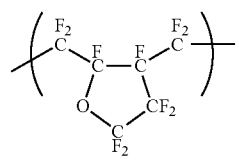

(p2-2)

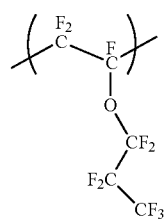

(p2-3)

Production Example 3

Production of Fluorinated Polymer P3

Into a stainless steel autoclave equipped with a stirrer and having an internal capacity of 200 mL, 0.70 g of V601 (manufactured by Wako Pure Chemical Industries, Ltd.) as a polymerization initiator was charged, followed by deaeration under reduced pressure, and then 14.0 g $CF_2$=$CFOCF_2CF_2CF_2COOCH_3$, 32.0 g of PPVE, and 32.0 g of $C_6F_{13}H$ were charged. 6.6 g of tetrafluoroethylene (hereinafter also referred to as "TFE") was injected under pressure with stirring, and the internal temperature was raised up to 80° C. to initiate polymerization. While keeping the internal pressure at 0.5 MPa, TFE was successively added to carry out polymerization for 8.5 hours. The amount of TFE added was 11.0 g.

After cooling the autoclave, the content was put into a 500 mL glass beaker, and 200 g of methanol was added thereto with stirring thereby to precipitate a copolymer. After removing a supernatant, the resultant was dissolved in $C_6F_{13}H$, and methanol was added thereto to carry out reprecipitation, followed by drying to obtain 23 g of a fluorinated polymer P3. The unit composition of the fluorinated polymer P3 was such that the proportion of unit (p3-1) derived from $CF_2$=$CFOCF_2CF_2CF_2COOCH_3$ was 10 mol %, the proportion of unit (p3-2) derived from TFE was 70 mol %, and the proportion of unit (p3-3) derived from PPVE was 20 mol %, and the mass average molecular weight was 17,200.

The above units (p3-1), (p3-2) and (p3-3) are as follows.

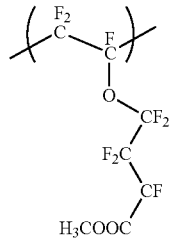
(p3-1)

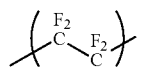
(p3-2)

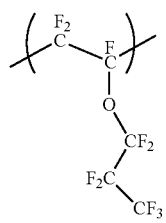
(p3-3)

Production Example 4

Production of Fluorinated Polymer P4

Into a stainless steel autoclave equipped with a stirrer and having an internal capacity of 200 mL, 1.4 g of PEROYL TCP (manufactured by NOF Corporation) was charged as a polymerization initiator, followed by deaeration under reduced pressure, and then 11.3 g $CF_2=CFOCF_2CF_2CF_2COOCH_3$, 30.0 g of PPVE and 120 g of AK-225 (manufactured by Asahi Glass Company, Limited) were charged therein. 13.0 g of tetrafluoroethylene (TFE) was injected under pressure with stirring, then the internal temperature was raised up to 55° C. to initiate polymerization, and the polymerization was carried out for 6 hours, whereby the internal pressure was reduced from 0.5 MPa to 0.15 MPa.

After cooling the autoclave, the content was put into a 500 mL glass beaker, and 200 g of methanol was added thereto with stirring to precipitate a copolymer. After removing a supernatant, the resultant was dried to obtain 20 g of a fluorinated polymer P4. The unit composition of the fluorinated polymer P4 was such that the proportion of unit (p4-1) derived from $CF_2=CFOCF_2CF_2CF_2COOCH_3$ was 7 mol %, the proportion of unit (p4-2) derived from TFE was 72 mol %, and the proportion of unit (p4-3) derived from PPVE was 21 mol %, and the mass average molecular weight was 14,700.

The above units (p4-1), (p4-2) and (p4-3) are as follows.

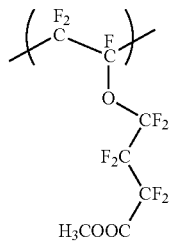
(p4-1)

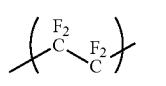
(p4-2)

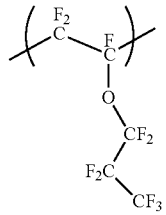
(p4-3)

Production Example 5

Production of Fluorinated Polymer P5

In accordance with Synthesis Example 2 of Patent Document 2 (WO2009/096342), 65 g of a fluorinated polymer P5 as tetrafluoroethylene (TFE)/perfluorotetramethylene divinyl ether (hereinafter also referred to as "C4DVE")/PPVE copolymer containing $CF_2=CFO-$ groups was obtained. Further, the composition of the fluorinated polymer P5 and the content of perfluorovinyl groups were measured by $^{19}F$-NMR, whereby the molar ratio of unit (p5-1) derived from TFE, unit (p5-2) derived from C4DVE and unit (p5-3) derived from PPVE in the fluorinated polymer P5 was 61/12/27, the content of perfluorovinyl groups in the fluorinated polymer P5 was 0.6 mmol/g, and the mass average molecular weight was 7,600.

The above units (p5-1), (p5-2) and (p5-3) are as follows.

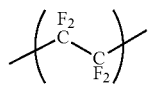
(p5-1)

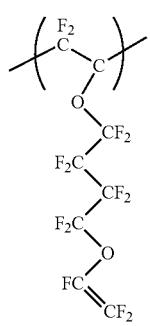
(p5-2)

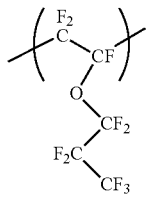

(p5-3)

Ex. 1 to 5

The fluorinated polymer obtained in each of Production Examples 1 to 5 was subjected to flow casting on a glass plate at 100° C., followed by cooling to room temperature. Then, the fluorinated polymer was irradiated with ultraviolet rays (UV) having a wavelength of 254 nm at 8 mW/cm$^2$ for 4 hours in each of Ex. 1 to 4, and 2 hours in Ex. 5, by using a 40 W low-pressure mercury lamp (manufactured by Sen Light Corporation) in a nitrogen atmosphere, to obtain a film having no stickiness on the surface.

The resulting film was immersed in AK-225 (product name, manufactured by Asahi Glass Company, Limited) to confirm whether a crosslinking reaction proceeded. When the crosslinking reaction proceeded, the film was swelled but its shape was held, and if the crosslinking reaction failed to proceed, the film was dissolved and deformed. Here, the film obtained in each of Ex. 1 to 5 was crosslinked, and its shape was held.

The content of COOCH$_3$ groups in the fluorinated polymer and the amount of HF in the resulting film were quantified, and the results are shown in Table 1.

Further, a LED device was encapsulated with the fluorinated polymer obtained in each of Production Examples 2 and 5.

Into a concave portion of a LED device comprising a cup-shaped alumina reflector mounted with a blue LED (wavelength: 460 nm) chip, the fluorinated polymer P2 or P5 was injected and cured by irradiation with UV under the above-mentioned conditions, whereby the LED device was encapsulated.

A current was applied at 3.5 V and 350 mA to the LED device encapsulated with the fluorinated polymer obtained in Production Example 2, and even after expiration of 2 months, the amount of current was unchanged and the transparency of the encapsulating resin was maintained. On the other hand, a current was applied at 3.5 V and 350 mA to the LED device encapsulated with the fluorinated polymer obtained in Production Example 5, and after expiration of one month, the transparency of the encapsulating resin was maintained, but the amount of current at 3.5 V was reduced to 170 mA.

TABLE 1

|  | Ex. | | | | |
| --- | --- | --- | --- | --- | --- |
|  | 1 | 2 | 3 | 4 | 5 |
| Fluorinated polymer | P1 | P2 | P3 | P4 | P5 |
| Content of COOCH$_3$ group in fluorinated polymer (mmol/g) | 1.6 | 0.84 | 0.48 | 0.41 | — |
| Amount of HF produced (mg/g) | 2.5 | 1.7 | 0.24 | 0.27 | 9.1 |

The film obtained in each of Ex. 1 to 4 was made of a fluorinated crosslinked product having a crosslinked moiety formed by irradiating the fluorinated polymer with ultraviolet rays so as to be crosslinked, and therefore the amount of HF produced was small, and the stability was excellent. In particular, in Ex. 3 and Ex. 4 where the fluorinated polymer had a proportion of the unit (1) of from 5 to 15 mol % in all units and contained the unit (3), the amount of HF produced was very small, and the stability was particularly excellent.

On the other hand, the film obtained in Ex. 5 was insufficient in stability since a large amount of HF was produced from a component decomposed at the same time as the formation of crosslinkage by irradiating the fluorinated polymer with ultraviolet rays.

Production Example 6

Production of Fluorinated Polymer P6

Into a stainless steel autoclave equipped with a stirrer and having an internal capacity of 200 mL, 0.13 g of V601 (manufactured by Wako Pure Chemical Industries, Ltd.) as a polymerization initiator was charged, followed by deaeration under reduced pressure, and then 21.4 g CF$_2$=CFOCF$_2$CF$_2$CF$_2$COOCH$_3$, 18.6 g of PPVE and 219 g of AC-2000 (manufactured by Asahi Glass Company, Limited) were charged therein. 18.6 g of trifluoroethylene (hereinafter also referred to as "TrFE") was injected under pressure with stirring, then the internal temperature was raised up to 70° C. to initiate polymerization, and the polymerization was carried out for 4 hours, whereby the internal pressure was reduced from 1.26 MPa to 1.17 MPa.

After cooling the autoclave, the content was put into a 500 mL glass beaker, and then 500 g of hexane was added thereto with stirring to precipitate a copolymer. After removing a supernatant, the resultant was dried to obtain 10.4 g of a fluorinated polymer P6. The unit composition of the fluorinated polymer P6 was such that the proportion of unit derived from CF$_2$=CFOCF$_2$CF$_2$CF$_2$COOCH$_3$ was 11.3 mol %, the proportion of unit derived from TrFE was 84 mol %, and the proportion of unit derived from PPVE was 4.7 mol %, and the mass average molecular weight was 67,000.

Production Example 7

Production of Fluorinated Polymer P7

Into a stainless steel autoclave equipped with a stirrer and having an internal capacity of 200 mL, 130 g of ultrapure water, 0.27 g of ammonium persulfate (manufactured by Tokyo Chemical Industry Co., Ltd.) as a polymerization initiator, 0.5 g of ammonium perfluorooctanoate as a dispersant, 0.3 g of sodium monohydrogen phosphate as a buffer, 0.18 g of sodium dihydrogen phosphate and 17.4 g of CF$_2$=CFOCF$_2$CF$_2$CF$_2$COOCH$_3$ were charged, and the gas phase portion was replaced with nitrogen. Then, 8.5 g of hexafluoropropylene (HFP) and 6.7 g of TrFE were injected under pressure with stirring, then the internal temperature was raised up to 70° C. so as to initiate polymerization, and the polymerization was carried out for 5 hours, whereby the internal pressure was reduced from 1.57 MPa to 1.19 MPa.

After cooling the autoclave, the resulting slurry was frozen to precipitate a polymer, and then the content was separated by a glass filter. Thereafter, an operation to wash the polymer with deionized water and separate it by a glass filter was repeated three times, followed by drying to obtain 11.7 g of a fluorinated polymer P7. The unit composition of the fluorinated polymer P7 was such that the proportion of unit derived from $CF_2=CFOCF_2CF_2CF_2COOCH_3$ was 36.5 mol %, the proportion of unit derived from TrFE was 57.5 mol %, and the proportion of unit derived from HFP was 6 mol %, and the mass average molecular weight was 13,000.

The fluorinated polymer P7 was further dissolved in ethylene glycol dimethyl ether, and was filtrated by a PTFE filter having a pore diameter of 0.2 μm. Then, pure water was added thereto to precipitate a polymer, then a supernatant was removed, and the fluorinated polymer P7 was dried to carry out purification.

Production Example 8

Production of Fluorinated Polymer P8

A fluorinated polymer P8 was synthesized in the same manner as in Production Example 4 except that BVE was used instead of PPVE.

The unit composition of the fluorinated polymer P8 was such that the proportion of unit derived from $CF_2=CFOCF_2CF_2CF_2COOCH_3$ was 5 mol %, the proportion of unit derived from BVE was 32 mol %, and the proportion of unit derived from TFE was 63 mol %, and the mass average molecular weight was 16,400.

Ex. 6 to 8

The ultraviolet ray transmittance (transmittance at a wavelength of 365 nm) of the fluorinated crosslinked product formed from each of the fluorinated polymers P6, P7 and P8, was measured by the following method. The results are shown in Table 2.

The fluorinated polymer was subjected to hot pressing at from 100 to 110° C. on a glass plate to prepare a 0.5 mm-thick sheet. The sheet was irradiated with UV by a low-pressure mercury lamp, then peeled from the glass plate to obtain a 0.5 mm-thick sheet-form fluorinated crosslinked product. With respect to the fluorinated crosslinked product, the transmittance (%) at a wavelength of 365 nm was measured by an ultraviolet visible light spectrophotometer UV3100 (Manufactured by Shimadzu Corporation).

TABLE 2

|  | Ex. | | |
| --- | --- | --- | --- |
|  | 6 | 7 | 8 |
| fluorinated polymer | P6 | P7 | P8 |
| Transmittance at a wavelength of 365 nm (%) | 84.5 | 75.1 | 87.1 |

Ex. 9

The fluorinated polymer P6 obtained in Production Example 6 was used to encapsulate LED device.

A sheet (thickness: 0.5 mm, prepared by hot pressing the fluorinated polymer P6 onto a glass plate, at from 100 to 110° C.) formed from the fluorinated polymer P6, was punched by a punch having a diameter of 3 mm, and was installed to a concave portion (diameter: about 3 mm) of a LED device comprising a cup-shaped alumina reflector mounted with a blue LED (wavelength: 460 nm) chip. Then, a release film was placed thereon and heated at 110° C. in a vacuum oven while applying a load by a weight, whereby the fluorinated polymer P6 was subjected to flow-casting into minute portions of the concave portion of the LED device. The LED device thus encapsulated was cooled and the release film was peeled, and then the LED device was irradiated with UV by a low-pressure mercury lamp to obtain a fluorinated crosslinked product formed from the fluorinated polymer P6.

A current was applied at 3.5 V and 350 mA to the LED device encapsulated, and even after expiration of 2 months, the amount of current was unchanged and the transparency of the fluorinated crosslinked product formed from the fluorinated polymer P6 was maintained.

INDUSTRIAL APPLICABILITY

According to the present invention, it is possible to provide a fluorinated crosslinked product which produces less HF and is excellent in stability.

The fluorinated crosslinked product in the present invention is useful as an optical material, particularly useful as a material for a lens, a material for encapsulating a device (particularly a material for encapsulating a light emitting device (short wavelength light emitting device, such as white LED) or an organic EL device, or a material for encapsulating a solar battery cell), an inorganic EL phosphor dispersing material or a material for an optical waveguide.

The fluorinated crosslinked product of the present invention, which is stable to light particularly at 300 nm or higher, is useful as a material for encapsulating UV-LED having a wavelength at 365 nm or higher.

Further, a fluorinated polymer and a crosslinkable composition used for forming the fluorinated crosslinked product of the present invention, is useful as a heat-resistance/chemical-resistance sealing material, an adhesive or a coating material. Further, the fluorinated crosslinked product of the present invention has high insulating properties and low dielectric constant, and therefore the fluorinated polymer and the crosslinkable composition may be used as a resin material with which glass cloth is impregnated and which is cured for preparing a circuit substrate. The fluorinated polymer and the crosslinkable composition, which is curable at room temperature and has stickiness in a semi-cured state, is used as a material for encapsulating e.g. LCD, a dye-sensitized solar cell or an organic solar cell, a material for a side seal or an adhesive.

Further, the fluorinated polymer and the crosslinkable composition to be used for forming the fluorinated crosslinked product of the present invention is also used as various patterning materials, an antireflection material for e.g. a flexible display or an antifouling coating material.

The coating composition containing e.g. the fluorinated polymer and a solvent, which is capable of coating and has surface non-stickiness, is also useful as a releasing agent, an antifouling coating material, a chemical resistant coating material. Further, it is also useful as an antifouling coating material for preventing attachment of a toner in a copying machine or an antifouling coating material for an apparatus for producing food, a water repellent coating agent for glass of buildings, automobiles, etc.

Moreover, the fluorinated polymer is useful as a crosslinkable polymer component for a fluorine-based ion exchanged membrane to be used for salt electrolysis or a fuel cell material.

What is claimed is:

1. A process for producing a fluorinated crosslinked product, the process comprising:

irradiating a fluorinated polymer with active energy rays having a wavelength of from 150 to 300 nm, wherein the fluorinated polymer is at least one member selected from the group consisting of:

a polymer consisting of a unit (1) and a unit (2), wherein the unit (1) is represented by the following formula (1):

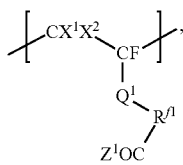  (1)

wherein $X^1$ and $X^2$ are each independently a hydrogen atom or a fluorine atom, $R^{f1}$ is a fluoroalkylene group or a fluoroalkylene group having at least two carbon atoms and an etheric oxygen atom between carbon-carbon atoms, $Q^1$ is a single bond or an etheric oxygen atom, and $Z^1$ is OH, $OR^1$ or $NR^2R^3$, wherein $R^1$ is an alkyl group, and $R^2$ and $R^3$ are each independently a hydrogen atom or an alkyl group, wherein the unit (2) is at least one member selected from the group consisting of units represented by the following formulas (2-1) to (2-4):

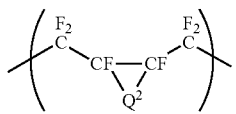  (2-1)

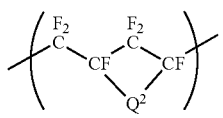  (2-2)

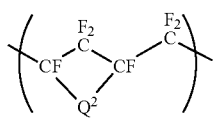  (2-3)

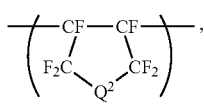  (2-4)

wherein Q2 is a Cl-5 perfluoroalkylene group which optionally contains an etheric oxygen atom and in which some of fluorine atoms are optionally substituted by halogen atoms other than fluorine atoms;

a polymer consisting of the unit (1), the unit (2), and a unit (3), wherein the unit (3) is at least one unit derived from a fluoroethylene:

a polymer consisting of the unit (1), the unit (2), and a unit (4), wherein the unit (4) is at least one unit represented by the following formula (4):

—[CX3X4.CY1Y2]—  (4), wherein X3 and X4 are each independently a hydrogen atom, a fluorine atom, or a chlorine atom, Y1 is a hydrogen atom, a fluorine atom, or a chlorine atom, Y2 is a hydrogen atom, a fluoroalkyl group which optionally contains an etheric oxygen atom between carbon-carbon atoms, a fluoroalkoxygroup which optionally contains an etheric oxygen atom between carbon-carbon atoms;

a polymer consisting of the unit (1), the unit (2), the unit (3), and the unit (4);

a polymer consisting of the unit (1), the unit (3), and the unit (4); and a polymer consisting of the unit (1) and the unit (4), wherein a proportion of the unit (1) is from 3 mol % to 50 mol % based on the total units in the fluorinated polymer.

2. The process according to claim 1, wherein the unit (1) is —[CF$_2$—CF(O(CF$_2$)$_3$COOCH$_3$)]— or —[CF$_2$—CF(OCF$_2$CF(CF$_3$)O(CF$_2$)$_3$COOCH$_3$)]—.

3. The process according to claim 1, wherein the fluoroethylene is at least one of tetrafluoroethylene, trifluoroethylene, and chlorofluoroethylene.

4. The process according to Claim 1, wherein the unit (4) is a unit derived from a perfluoromethyl vinyl ether, a unit derived from a perfluoropropyl vinyl ether, a unit derived from a hexafluoropropene or a unit derived from ethylene.

5. The process according to claim 1, wherein the fluorinated polymer has a mass average molecular weight of from 3,000 to 20,000.

6. The process according to claim 1, wherein the fluorinated polymer has a mass average molecular weight of from 20,000 to 200,000.

7. The process according to claim 1, wherein the fluorinated polymer has —COZ$^1$ in the formula (1) in an amount of from 0.1 to 4 mmol/g.

8. The process according to claim 1, wherein the fluorinated crosslinked product has a transmittance at a wavelength of 365 nm of at least 70% in a film having a thickness of 0.5 mm.

9. A light emitting device encapsulated in a light-transmitting manner with a fluorinated crosslinked product obtained by the process of claim 1.

10. The light emitting device according to claim 9, which is UV-LED.

11. The process according to claim 1, wherein the fluorinated polymer has —COZ$^1$ in the formula (1) in an amount of from 0.1 to 1 mmol/g.

* * * * *